United States Patent [19]

Kawasaki

[11] Patent Number: 5,635,752

[45] Date of Patent: Jun. 3, 1997

[54] SEMICONDUCTOR DEVICE HAVING SOURCE AND DRAIN REGIONS WHICH INCLUDE HORIZONTALLY EXTENDING SECONDARY DEFECT LAYERS

[75] Inventor: Youji Kawasaki, Hyogo, Japan

[73] Assignee: Mitsubishi Denki Kabushiki Kaisha, Tokyo, Japan

[21] Appl. No.: 397,521

[22] Filed: Mar. 2, 1995

[30] Foreign Application Priority Data

Jun. 14, 1994 [JP] Japan ..................... 6-131598

[51] Int. Cl.$^6$ ........................................... H01L 29/30
[52] U.S. Cl. ..................... 257/617; 257/75; 438/308; 438/306
[58] Field of Search ..................... 257/617, 327, 257/345, 66, 70, 75; 437/247

[56] References Cited

U.S. PATENT DOCUMENTS

| | | | |
|---|---|---|---|
| 4,053,925 | 10/1977 | Burr et al. | 257/376 |
| 5,142,344 | 8/1992 | Yamazaki | 257/75 |
| 5,276,344 | 1/1994 | Arima et al. | 257/327 |
| 5,455,437 | 10/1995 | Komori et al. | 257/617 |

OTHER PUBLICATIONS

Bhatia, "Isolation Process For Shallow Junction Devices," IBM Tech. Disc. Bull., vol. 19, No. 11; Apr. 1977, p. 4171.

*Primary Examiner*—Jerome Jackson
*Assistant Examiner*—Nathan K. Kelley
*Attorney, Agent, or Firm*—Lowe, Price, LeBlanc & Becker

[57] ABSTRACT

A semiconductor device having shallow junction, in which carrier concentration will not be reduced, sheet resistance will not be increased, and contact characteristic at a surface will not become inferior, is provided. A gate electrode is provided on a semiconductor substrate. At a surface of semiconductor substrate, a pair of source/drain layers having top and bottom surfaces are provided on both sides of gate electrode. In source/drain layer, a secondary-defect layer which extends horizontally is formed between top surface and bottom surface.

4 Claims, 14 Drawing Sheets

SEMICONDUCTOR DEVICE HAVING SOURCE AND DRAIN REGIONS WHICH INCLUDE HORIZONTALLY EXTENDING SECONDARY DEFECT LAYERS

BACKGROUND OF THE INVENTION

1. Field of the Invention

The present invention relates generally to a semiconductor device, and more particularly, to an MOS transistor having shallow junction. The present invention relates also to a method of manufacturing such a semiconductor device.

2. Description of the Background Art

FIGS. 13–16 are cross sections showing the steps of manufacturing a conventional field effect transistor (MOSFET).

Referring to FIG. 13, a gate insulating film 51 is formed on a semiconductor substrate 50. A polysilicon film 52 is formed on gate insulating film 51. Polysilicon film 52 and gate insulating film 51 are patterned to a shape of a gate electrode 53.

Referring to FIG. 15, impurity ions are implanted into a surface of semiconductor substrate 50 on both sides of gate electrode 53, and a pair of source/drain regions 54 are formed. An interlayer insulating film 55 is formed on semiconductor substrate 50 to cover gate electrode 53. A contact hole 56 for exposing a portion of a surface of source/drain layer 54 is formed in interlayer insulating film 55. An Al electrode 57, i.e. a source/drain electrode is formed, which is connected through contact hole 56 to the source/drain layer.

The conventional MOSFET is produced in such a manner as described above. With miniaturization of a device, shallow junction has been required. The shallow junction means that, referring to FIG. 17, distance between a top surface 54a and a bottom surface 54b of source/drain region 54 is short. If junction is deep, as shown by dotted line 57 and chain dotted line 58, distance between the pair of source/drain regions 54 and 54 becomes short under gate electrode 53, which might cause punch through. Shallow junction has been required in order to prevent such punch through.

In order to form shallow junction, channeling (deep entrance of impurity ions) and diffusion of impurity ions in a substrate must be suppressed. Consequently, pre-ion-implantation in which nitride, silicon, germanium or the like is implanted into a surface of a substrate before implantation of electrically active impurity ions has been proposed.

FIGS. 18–21 are cross sections showing the steps of conventional pre-ion-implantation.

Referring to FIG. 18, a silicon substrate 11 which is formed of single crystal is prepared. Although a gate electrode has been formed already by this time, it is not shown in the figure.

Referring to FIG. 19, atoms of nitrogen, silicon, germanium or the like are implanted into a surface of silicon substrate 11, and an amorphous layer 12 is formed. Implantation of atoms 59 of silicon, nitrogen, germanium or the like causes crystal lattice disorder resulting in amorphous layer 12 formed at the surface of silicon substrate 11. Amorphous layer 12 is formed when the above-described atoms are implanted by more than a critical amount (an amount at which amorphous is formed). Then, electrically active impurity (arsenic or phosphorus in the case of n-type, and boron in the case of p-type) is implanted into amorphous layer 12 at high concentration (at least $1 \times e^{15}/cm^2$), and source/drain region 54 is formed. Pre-ion-implantation can suppress channeling and diffusion in the substrate. That is because disorder of the crystal lattice causes electrically active impurity ions to collide with the crystal lattice, which results in suppression of diffusion thereof, and because an amorphous layer has no path for atoms to spread into silicon at the time of thermal processing.

Referring to FIG. 20, thermal processing is performed at a temperature in the range of 600° to 900° C.

Thus, referring to FIGS. 20 and 21, solid phase epitaxial growth in which a monocrystal lattice serves as a nucleus takes place from a crystal surface of silicon substrate 11 in the direction of arrows, and a monocrystalline layer 16 in the substrate is formed.

At this time, a secondary-defect layer 15 which extends horizontally is formed between silicon substrate 11 and monocrystalline layer 16 in the substrate. Since use of nitrogen or the like for the pre-ion-implantation significantly reduces recrystallization rate of an amorphous layer, the amorphous layer is not completely restored to the monocrystalline layer in the substrate and amorphous layer 12 remains, as shown in FIG. 21.

In the figure, a portion indicated by reference character 54a is a top surface of source/drain region 54, and a portion indicated by reference character 54b is a bottom surface of source/drain region 54.

An MOSFET with such a source/drain region as shown in FIG. 21 has the following problems.

That is, referring to FIG. 21, since source/drain region 54 is not completely crystallized, electrical activation of impurity ions cannot be carried out in the remaining amorphous layer 12 (in other words, holes or electrons will not be produced therein.). Consequently, carrier concentration is significantly reduced, resulting in increase in sheet resistance, poor contact characteristic at the surface, or the like.

In addition, generation of a number of secondary defects (15) in an interface region between silicon substrate 11 and monocrystalline layer 16 in the substrate results in increased leak current when reverse bias is applied.

SUMMARY OF THE INVENTION

It is therefore an object of the present invention to provide a field effect transistor having shallow junction.

It is another object of the present invention to provide a field effect transistor having shallow junction which is improved to prevent reduction in carrier concentration.

It is a further object of the present invention to provide a field effect transistor having shallow junction in which leak current will not be produced at the time of application of reverse bias.

It is a still further object of the present invention to provide a manufacturing method of a field effect transistor having shallow junction in which carrier concentration will not be reduced.

It is a still further object of the present invention to provide a manufacturing method of a field effect transistor having shallow junction in which leak current will not be produced at the time of application of reverse bias.

A semiconductor device in accordance with the first aspect of the present invention includes a semiconductor substrate and a gate electrode which is provided on the semiconductor substrate. At a surface of the semiconductor substrate, a pair of source/drain layers having top and bottom surfaces are formed on both sides of the gate electrode. In the source/drain layer, a secondary defect layer which extends horizontally is formed between the top and bottom surfaces thereof.

According to a preferred implementation of the present invention, when distance between the top and bottom surfaces of the source/drain layer is 0.1 μm, the secondary-defect layer is formed 0.06 μm to 0.08 μm above the bottom surface.

In a manufacturing method of a semiconductor device in accordance with a second aspect of the present invention, first, a gate electrode is formed on a semiconductor substrate. At a surface of the semiconductor substrate on both sides of the gate electrode, an amorphous layer is formed by pre-ion-implantation. Electrically active atoms are implanted into the amorphous layer, whereby a pair of source/drain layers are formed. A silicon film is formed on the semiconductor substrate so as to come into contact with the amorphous layer. The semiconductor substrate is thermally processed, whereby the amorphous layer is changed into a monocrystalline layer. Then, the silicon film is removed. A bit line is connected to the pair of source/drain layers.

According to a preferred implementation of the present invention, after the pair of source/drain layers are formed, an oxide film at a surface of the semiconductor substrate is removed prior to formation of the silicon oxide film.

In the semiconductor device in accordance with the first aspect of the present invention, since a secondary-defect layer is concentrated into a source/drain layer, no secondary defect exists in a portion where a depletion layer extends.

In a manufacturing method of a semiconductor device in accordance with the second aspect of the present invention, a silicon film is formed on a semiconductor substrate so as to come into contact with an amorphous layer, and then, thermal processing is performed. Consequently, solid phase epitaxial growth occurs simultaneously downward from the top surface and upward from the bottom surface. As a result, solid phase epitaxial growth occurs efficiently, and the amorphous layer is completely recrystallized.

Crystal distortion is large at an interface of two layers which result from the solid face epitaxial growth from both directions. Accordingly, a secondary defect, which is produced in the semiconductor substrate at the time of pre-ion-implantation, moves to the portion of large crystal distortion.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described with reference to the drawings.

Embodiment 1

FIGS. 1–6 are cross sections simply illustrating a method in accordance with a first embodiment of the present invention.

Figure 1:
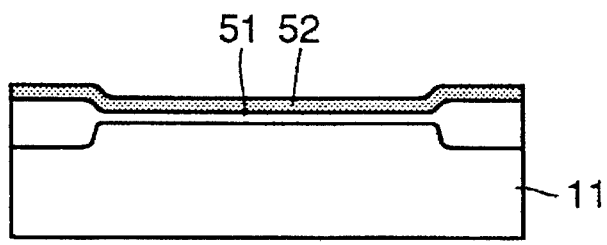
FIGS. 1–6 are cross sections showing in order the steps of a manufacturing method of a semiconductor device in accordance with a first embodiment of the present invention.
Figure 2:
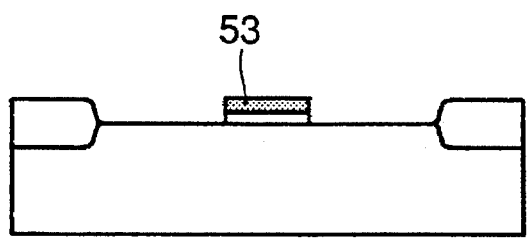

Referring to FIG. 1, a gate insulating film 51 is formed on a semiconductor substrate 11 (for example, a silicon substrate) which is formed of single crystal. A polysilicon film 52 is formed on gate insulating film 51. Referring to FIG. 2, gate insulating film 51 and polysilicon film 52 are patterned to a shape of a gate electrode 53.

Figure 3:
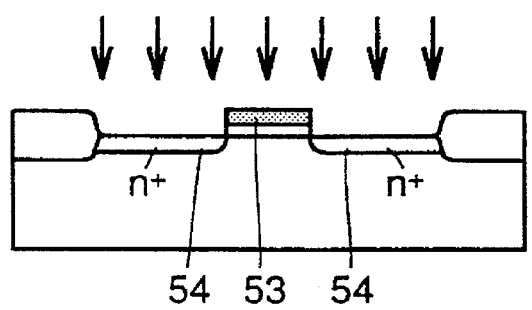

Referring to FIG. 3, pre-ion-implantation is performed using nitrogen, and then, electrically active impurity, i.e. phosphorus, arsenic, boron or $BF_2$ ions, is implanted, and a source/drain layer 54 is formed.

Figure 4:
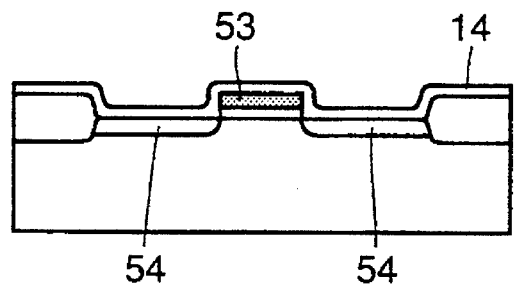

Referring to FIG. 4, a non-doped amorphous silicon film 14 is formed on semiconductor substrate 11 by low pressure chemical vapor deposition (hereinafter referred to as LPCVD) so as to come into contact with source/drain layer 54.

Thermal processing is performed at a temperature in the range of 600° to 900° C., and source/drain layer 54 is recrystallized.

Figure 5:
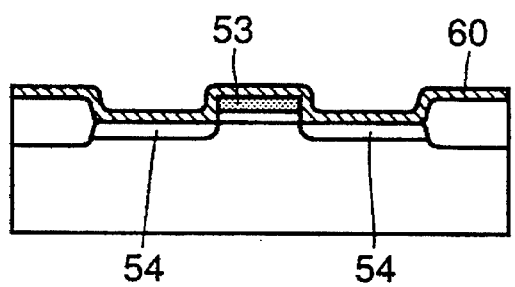
Figure 6:
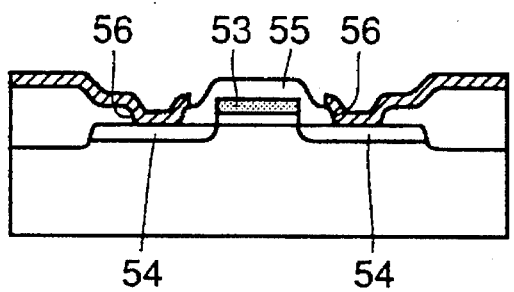

Referring to FIGS. 4 and 5, non-doped amorphous layer 14 is changed into an oxide film 60 by oxidation. Referring to FIGS. 5 and 6, oxide film 60 is removed by etching, for example, with hydrofluoric acid.

Referring to FIG. 6, an interlayer insulating film 55 is formed on semiconductor substrate 11 to cover gate electrode 53. A contact hole 56 for exposing a portion of a surface of source/drain layer 54 is formed in interlayer insulating film 55. An aluminum electrode, i.e. a bit line which is electrically connected through contact hole 56 to source/drain layer 54 is formed.

The present invention, in particular, a source/drain layer thereof will now be described in more detail.

Figure 7:
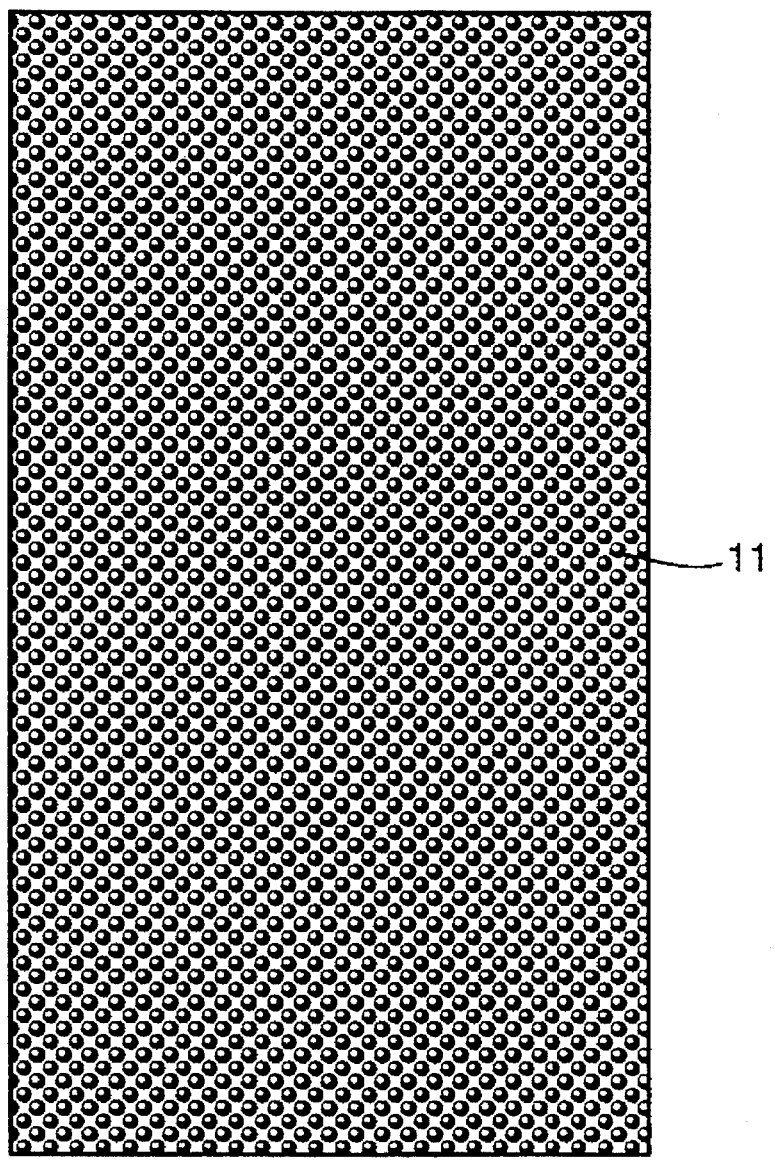
FIGS. 7–12 are cross sections of a semiconductor device showing in order the steps of forming a source/drain layer of the present invention.

Referring to FIG. 7, a semiconductor substrate 11, which is formed of single crystal is prepared.

Figure 8:
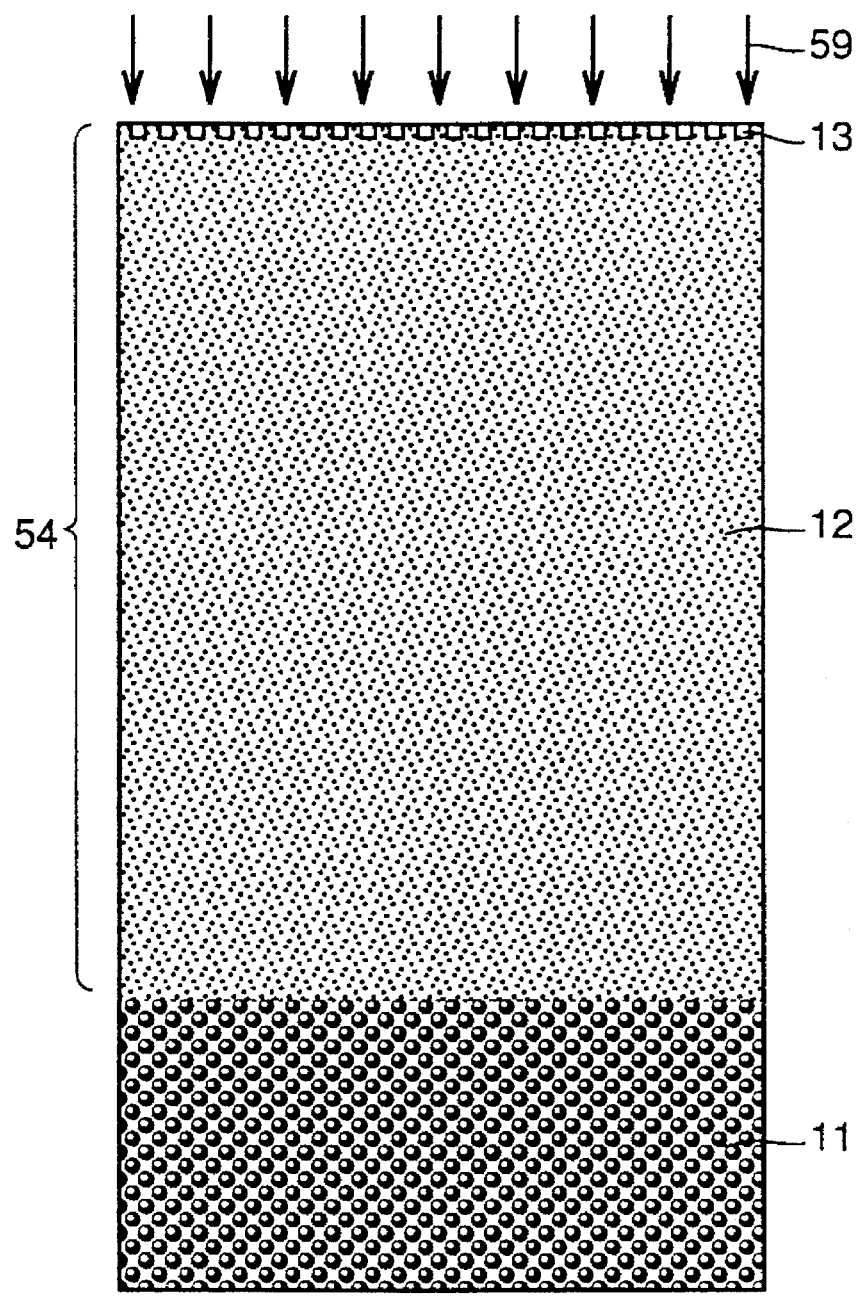

Referring to FIGS. 7 and 8, nitrogen is pre-ion-implanted into a surface of semiconductor substrate 11 by more than the critical amount, and an amorphus layer 12 is formed. Then, electrically active impurity (phosphorus, arsenic, boron, $BF_2$ or the like) of high concentration (at least $1\times10^{15}/cm^2$) is implanted into amorphous layer 12, and a source/drain layer 54 is formed.

Figure 9:
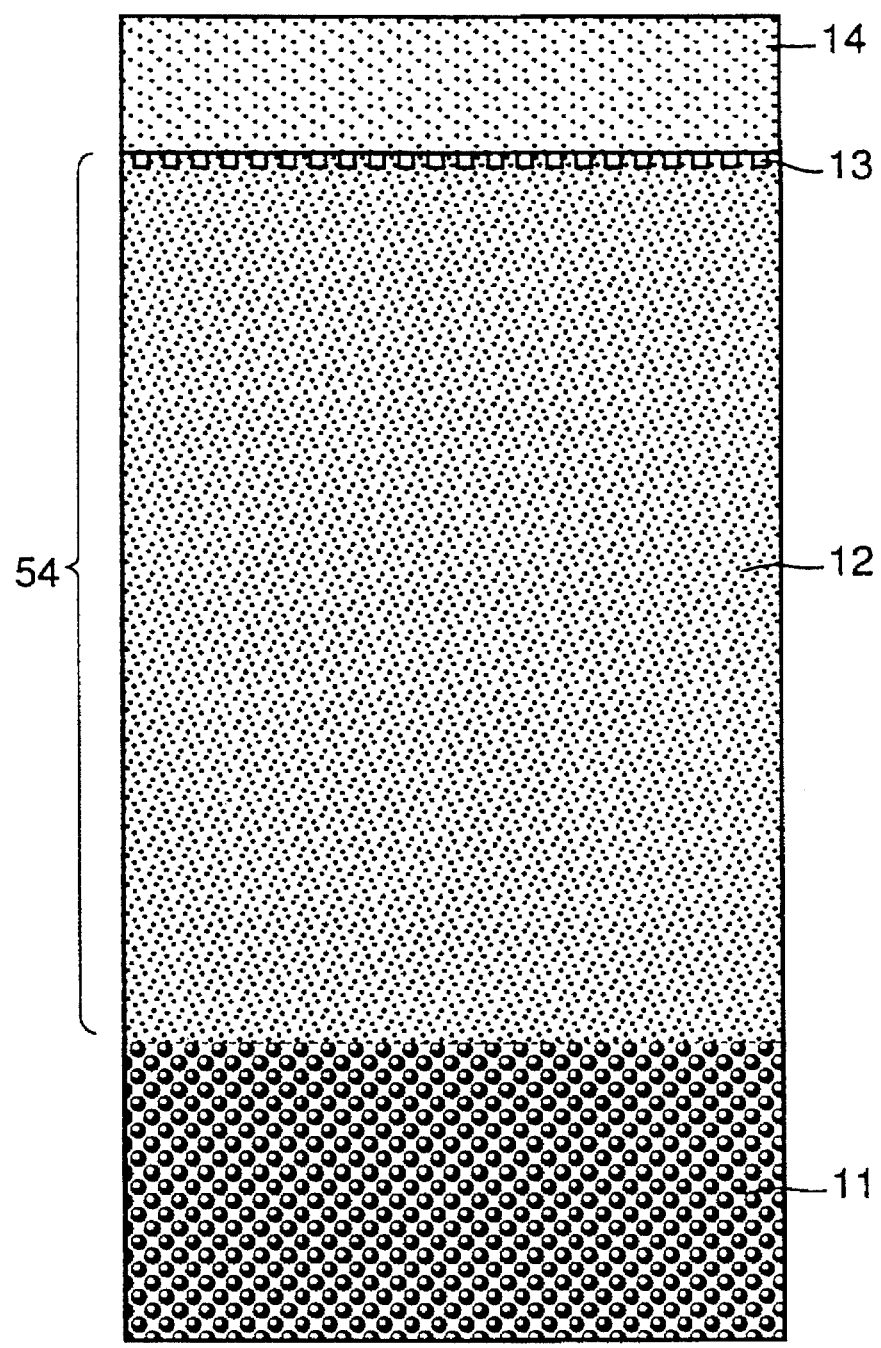

Referring to FIGS. 8 and 9, a silicon oxide film which has been formed on a surface of source/drain layer 54 is removed with HF vapor. Then, a non-doped amorphous silicon film 14 is formed on semiconductor substrate 11 by LPCVD so as to come into contact with amorphous layer 12. Non-doped amorphous silicon film 14 has a thickness of about 200 Å. Non-doped amorphous silicon film 14 may have any thickness in the range of 100 to 200 Å (0.01 to 0.02 μm). At the time of pre-ion-implantation, single crystal at the surface of semiconductor substrate 11 loses its regularity and changed into an amorphous layer 12, while monocrystalline layer 13 having a thickness of about 10 Å remains at a top surface thereof.

Figure 10:
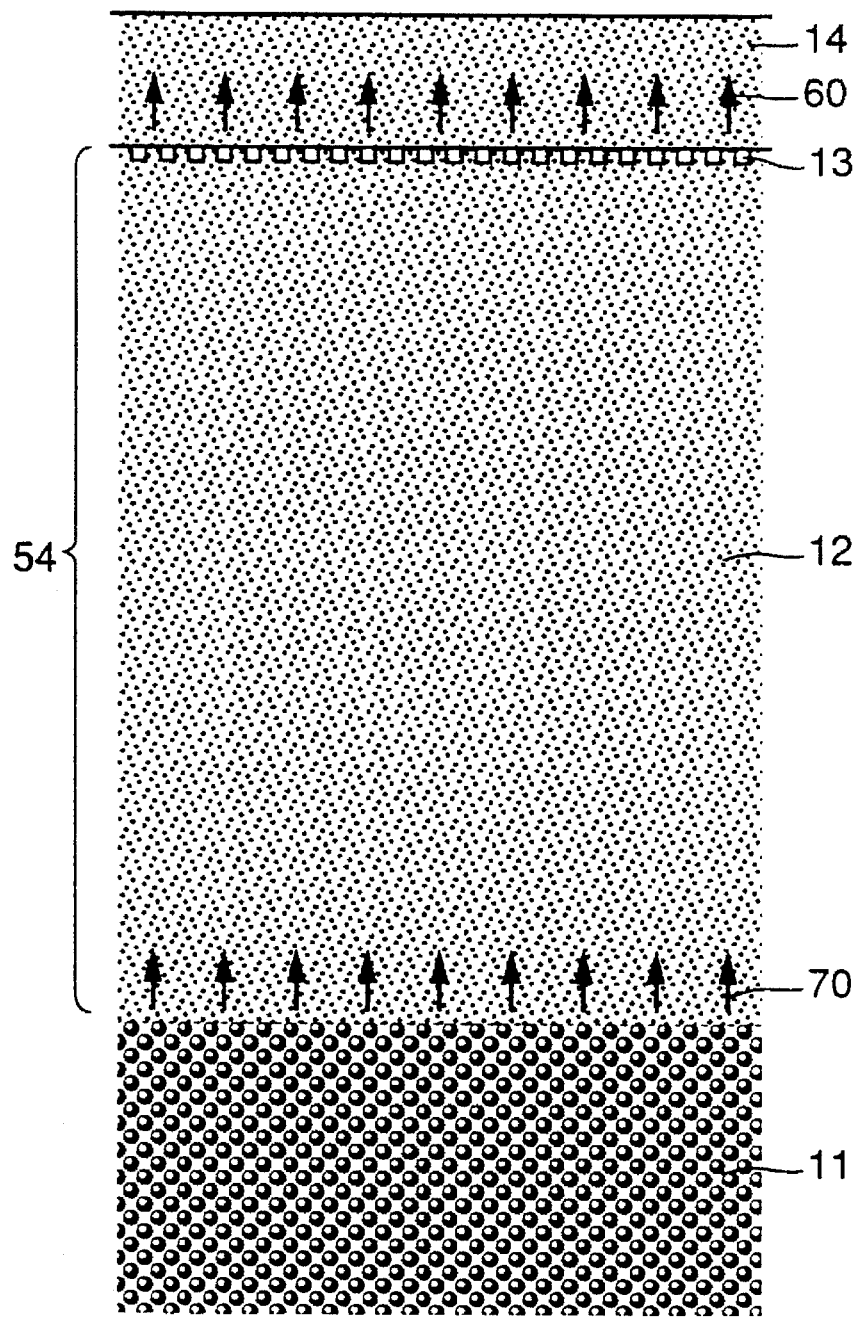

Referring to FIGS. 9 and 10, when thermal processing is performed at a temperature in the range of 600° to 900° C., solid phase epitaxial growth in which monocrystal lattice serves as a nucleus takes place in amorphous layer 12 from monocrystalline surface of silicon substrate 11 in the direction of arrow 70. Moreover, in non-doped amorphous silicon film 14, solid phase epitaxial growth in which monocrystal lattice of remaining monocrystalline layer 13 serves as a nucleus takes place in the direction of arrow 60. Since no impurity which disturbs crystallization exists in non-doped amorphous silicon film 14, stoichiometric bond of silicon atoms is facilitated.

Accordingly, solid phase epitaxial growth in the direction shown by arrow 60 will take place easily.

Figure 11:
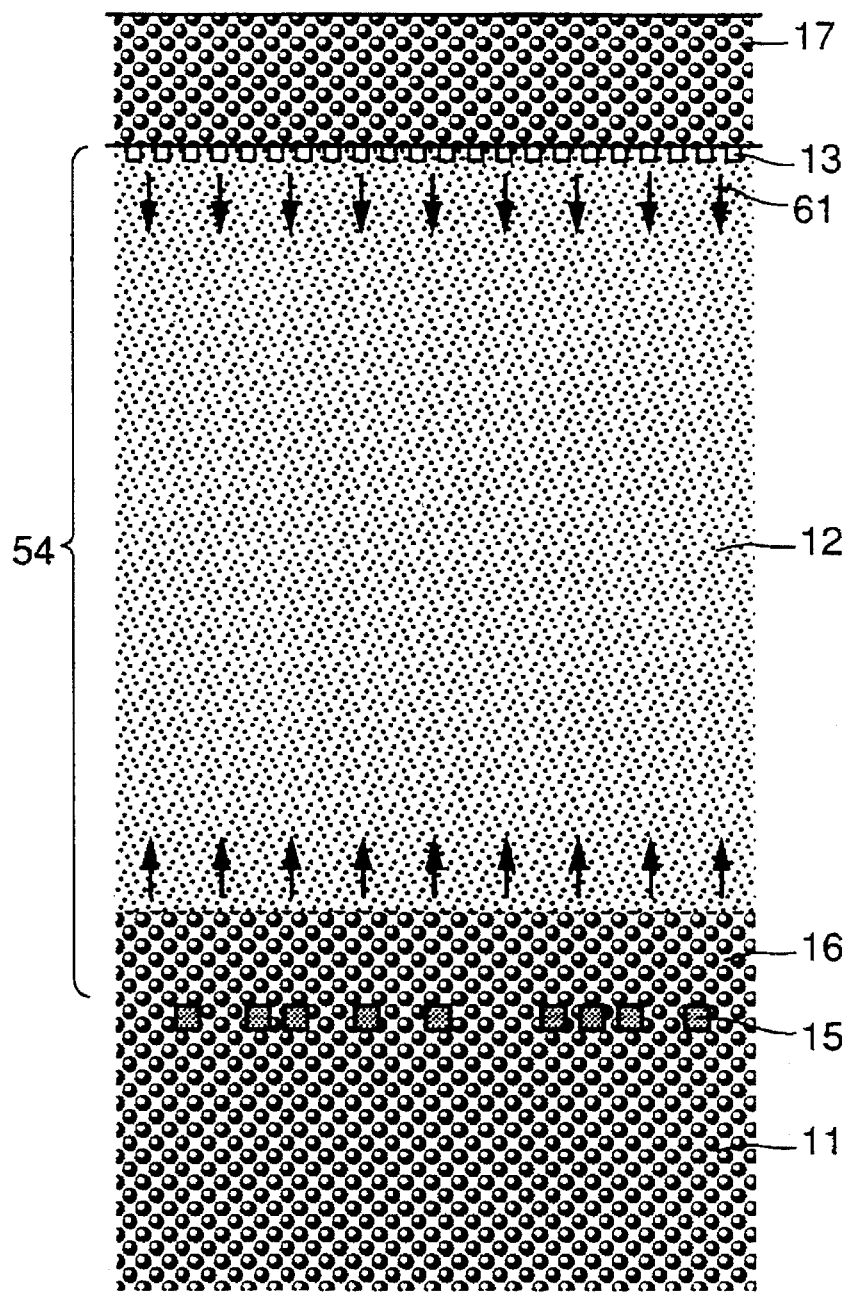
Figure 12:
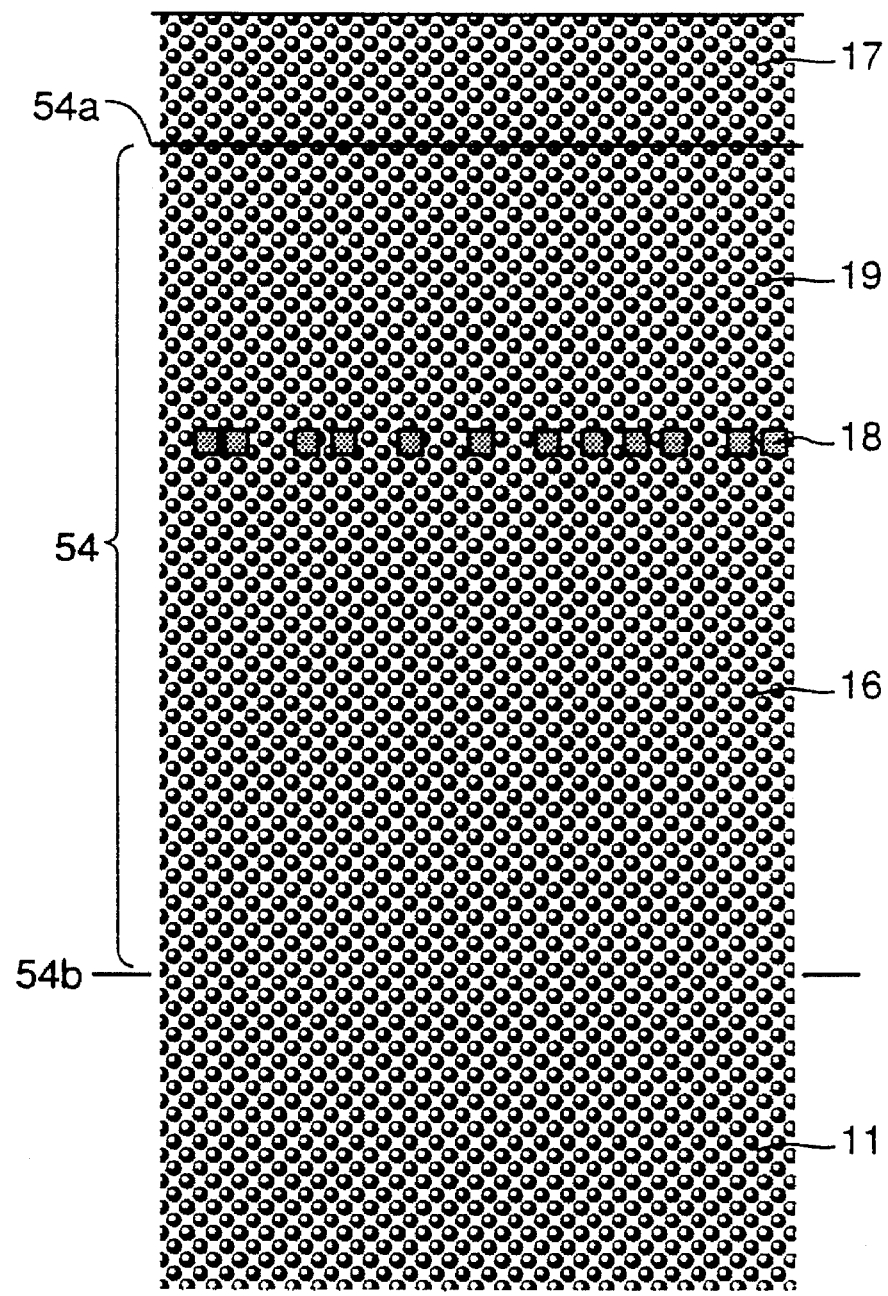
Figure 13:
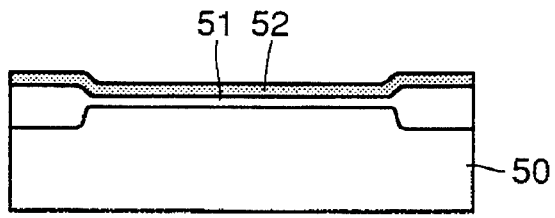
FIGS. 13–16 are cross sections of a semiconductor device showing in order the steps of a manufacturing method of a conventional field effect transistor.
Figure 14:
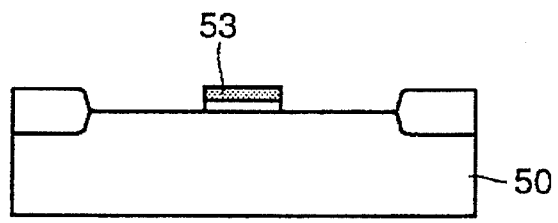
Figure 15:
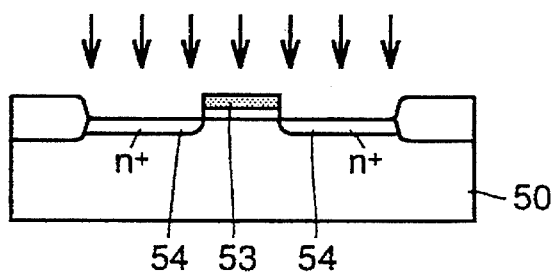
Figure 16:
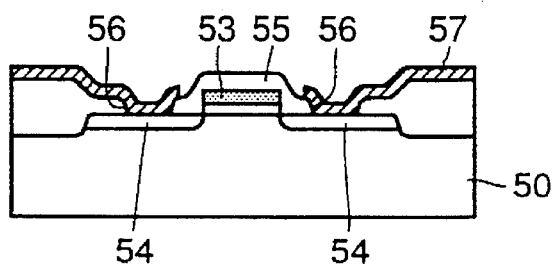
Figure 17:
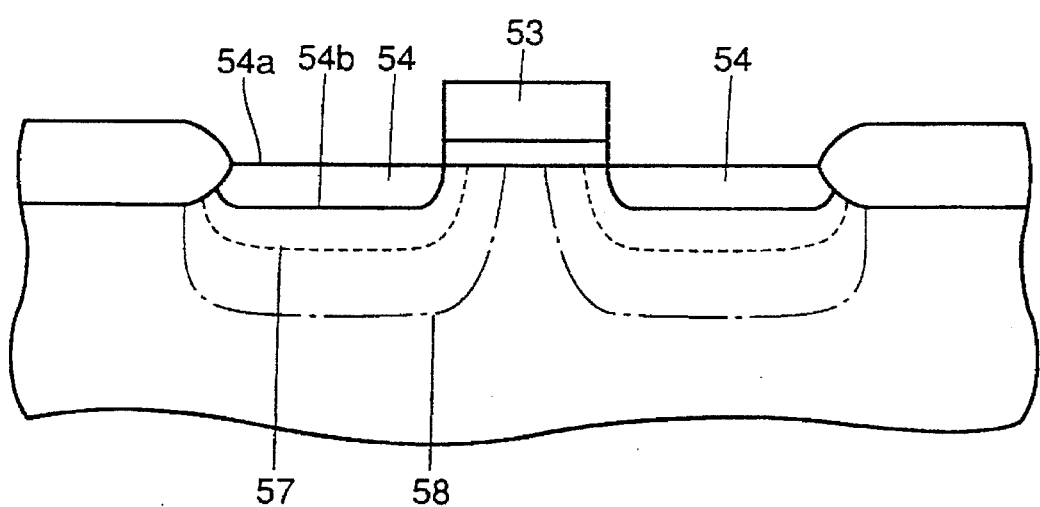
FIG. 17 is a cross section illustrating the fact that a field effect transistor having shallow junction must be formed.
Figure 18:
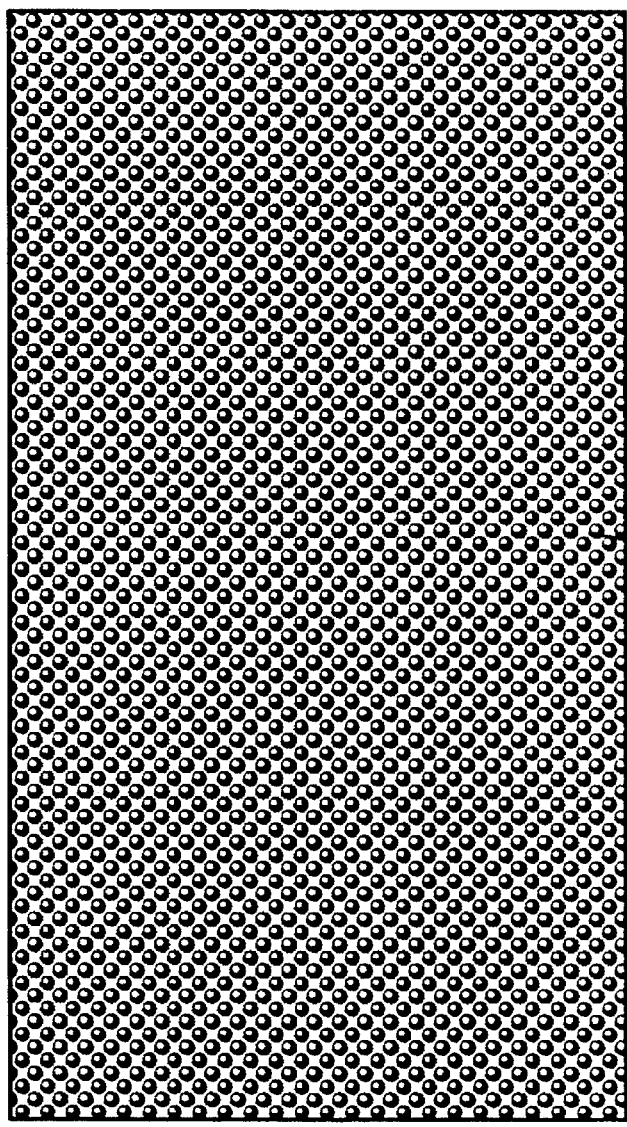
FIGS. 18–21 are cross sections of a semiconductor device showing in order the steps of forming a conventional source/drain layer.
Figure 19:
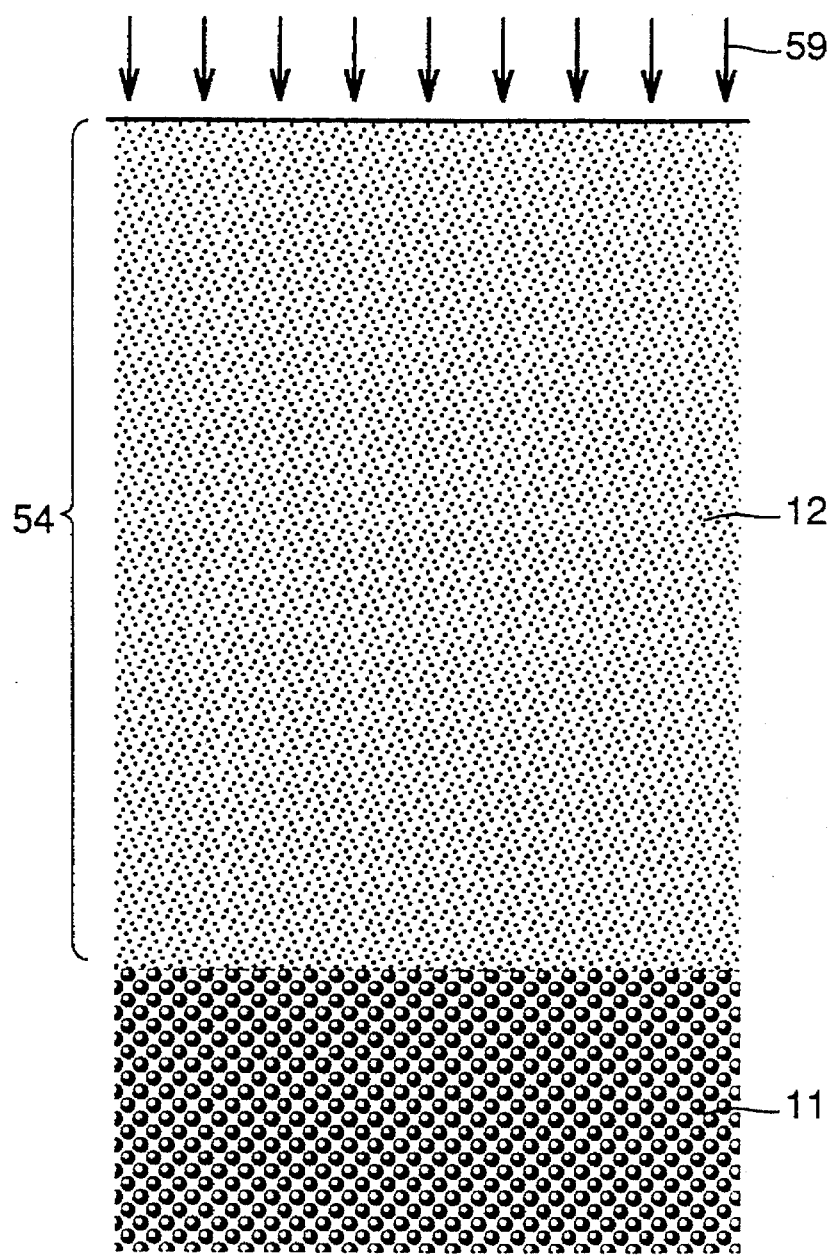
Figure 20:
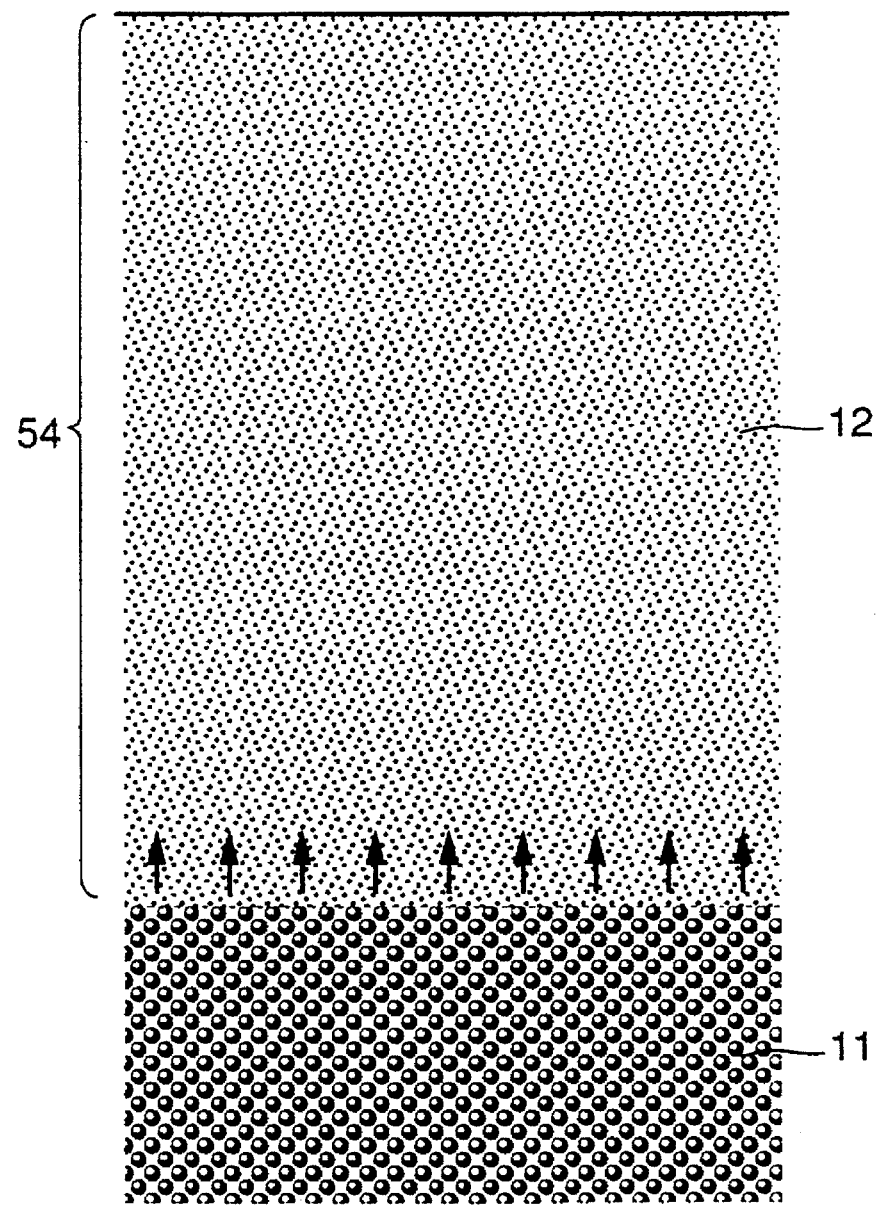
Figure 21:
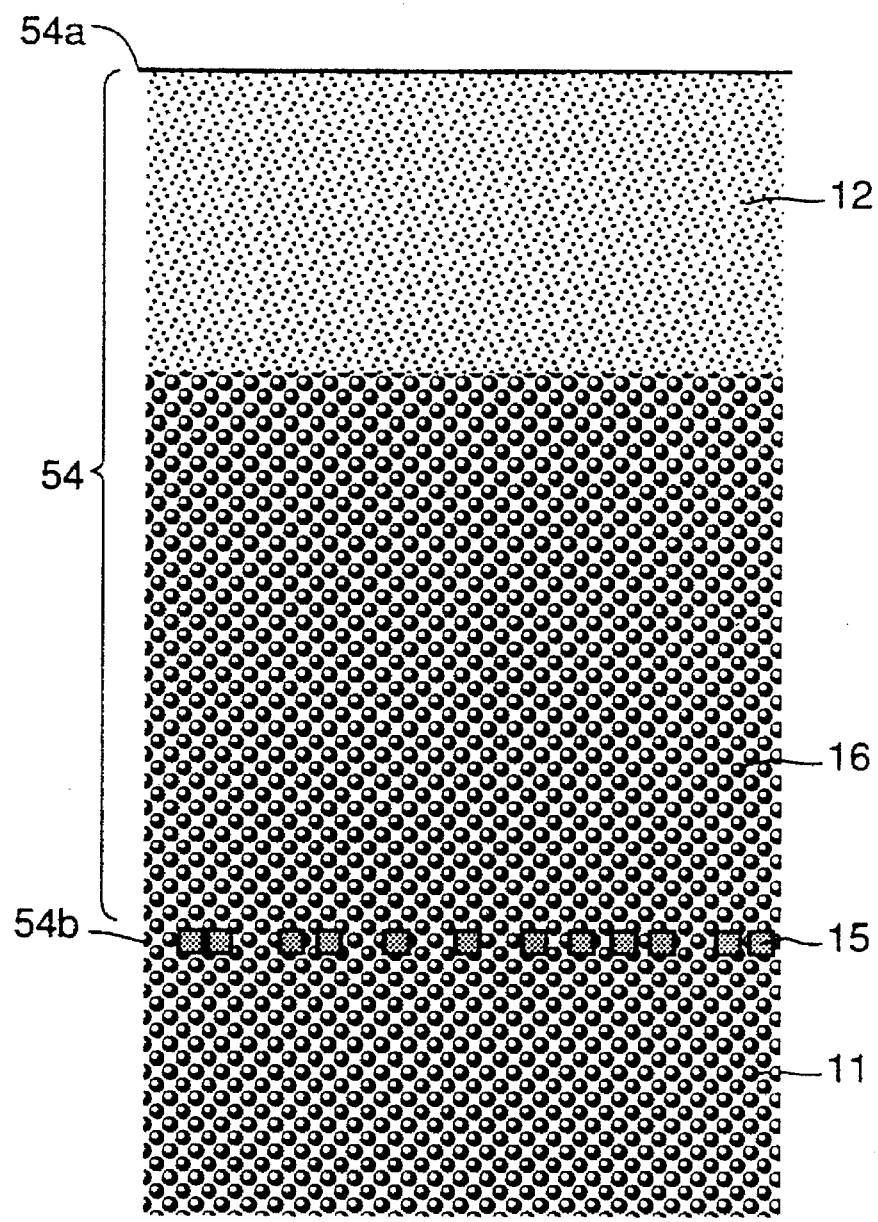

Referring to FIGS. 10 and 11, non-doped amorphous silicon film 14 is changed into a monocrystalline layer 17 at the surface by solid phase epitaxial growth in the direction shown by arrow 60. After monocrystalline layer 17 at the surface is produced, solid phase epitaxial growth in which monocrystal lattice serves as a nucleus starts from a surface of remaining monocrystalline layer 13 into amorphous layer 12 (i.e. in the direction shown by arrow 61). Referring to FIGS. 11 and 12, amorphous layer 12 is thus completely changed into the monocrystalline layer (i.e. recrystallization layer 19 at the surface and recrystallization layer 16 in the substrate).

According to the first embodiment, amorphous layer 12 is efficiently recrystallized by solid phase epitaxial growth which takes place both upwardly and downwardly.

Also in the first embodiment, referring to FIG. 11, a number of secondary defects 15 are produced at an interface between semiconductor substrate 11 and recrystallized monocrystalline layer 16 in the substrate, as in the conventional semiconductor device. However, referring to FIG. 12, crystal distortion is large at an interface between recrystallization layer 19 at the surface and recrystallization layer 16 in the substrate. Consequently, secondary defects 15 are moved and gathered into the portion where crystal distortion is large, and moved secondary defects 18 are formed. Moved secondary defects 18 are formed as a result of the fact that secondary defects 15 are moved through lattice point by thermal energy and gathered into the portion where crystal distortion is large. Consequently, the number of secondary defects which have been conventionally produced can be reduced.

When distance between a top surface 54a and a bottom surface 54b of source/drain layer 54 is 0.1 µm, moved secondary defects 18 are formed at 0.06 to 0.08 µm above bottom surface 54b.

According to the first embodiment, since secondary defects 18 are gathered into source/drain layer 54, no secondary defect exists in a portion where a depletion layer extends. As a result, leak current will not be generated at the time of application of reverse bias. Since source/drain layer 54 is completely recrystallized, electrical activation of impurity is carried out sufficiently and carrier concentration will not be reduced. In addition, sheet resistance will not be increased and contact characteristic at the surface will not become inferior.

Monocrystalline layer 17 at the surface into which non-doped amorphous silicon film 14 has changed is oxidized, and then will be removed with HF vapor.

Embodiment 2

Although, in the first embodiment, description is given of the case where, referring to FIG. 8, amorphous layer 12 is formed by pre-ion-implantation which uses electrically inactive atoms such as nitrogen, silicon or germanium, the present invention is not limited to this, and the same effect as that in the first embodiment can be obtained even if the amorphous layer is formed by implantation of impurities, for example, ions of As, P, $BF_2$, boron or the like.

Embodiment 3

Although, in the first embodiment, description is given of the case where, referring to FIG. 9, non-doped amorphus silicon film 14 is formed on semiconductor substrate 11 so as to come into contact with amorphus layer 12, the present invention is not limited to this, and a polycrystalline silicon film may be formed instead of the non-doped amorphous silicon film. Although use of the polycrystalline silicon film results in formation of a polycrystalline silicon layer at the surface instead of a monocrystalline layer at the surface, activation of electrically active impurity or gettering of the secondary defects will occur. Thus, the same effect as that in the first embodiment can be obtained.

Embodiment 4

In the first embodiment, referring to FIG. 9, non-doped amorphous silicon film 14 is deposited after a silicon oxide film at the surface of source/drain layer 54 is removed. However, non-doped amorphous silicon film 14 may be formed directly on the silicon oxide film without removal of the silicon oxide film. According to a fourth embodiment, the step of removing the silicon oxide film with HF vapor is not necessary, resulting in simplification of a process.

Embodiment 5

In the first embodiment, thermal processing which is performed at a temperature in the range of 600° to 900° C. is described by way of example. The same effect can be obtained by use of either furnace annealing or rapid thermal annealing as a technique of thermal processing. Furnace annealing and rapid thermal annealing may be combined. In furnace annealing, low temperature (at most 600° C.) and long-time (at least 100 minutes) annealing and high temperature (at least 700° C.) and short-time (at most 60 minutes) annealing may be combined.

As described, in the semiconductor device in accordance with the first aspect of the present invention, since a secondary-defect layer is gathered into a source/drain layer, no secondary defect exists in the portion where a depletion layer extends, resulting in a semiconductor device in which leak current will not be generated at the time of application of reverse bias.

In the manufacturing method of the semiconductor device in accordance with the second aspect of the present invention, after a silicon film is formed on a semiconductor substrate so as to come into contact with an amorphous layer, thermal processing is performed. Accordingly, solid phase epitaxial growth occurs simultaneously downward from a top surface of the amorphous layer and upward from a bottom surface thereof. Thus, solid phase epitaxial growth occurs efficiently, and the amorphous layer can be recrystallized completely. Consequently, electrical activation of impurity is sufficiently carried out and carrier concentration will not be reduced. In addition, sheet resistance will not be increased and contact characteristic at a surface will not become inferior.

Crystal distortion is large at an interface between two layers which result from solid phase epitaxial growth from both upward and downward directions. Thus, secondary defects which has been produced at the time of pre-ion-implantation are moved into the portion where crystal distortion is large. Consequently, no secondary defect exists in the portion where the depletion layer extends, resulting in a semiconductor device in which leak current will not be generated at the time of application of reverse bias.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor substrate;
   a gate electrode provided on said semiconductor substrate; and
   a pair of substantially monocrystalline source/drain layers, having top and bottom surfaces, provided on both sides of said gate electrode at a surface of said semiconductor substrate, wherein
   a secondary-defect layer extends horizontally between said top and bottom surfaces in said source/drain layer.

2. The semiconductor device according to claim 1, wherein
   the distance between said top and bottom surfaces of said source/drain layer is 0.1 μm, and said secondary-defect layer extends 0.06 to 0.08 μm above said bottom surface.

3. A semiconductor device, comprising:
   a semiconductor substrate;
   a gate electrode provided on said semiconductor substrate; and
   a pair of substantially monocrystalline source/drain layers, having top and bottom surfaces, provided on both sides of said gate electrode at a surface of said semiconductor substrate, wherein
   a defect layer which is produced by heat treatment extends horizontally between said top and bottom surfaces in said source/drain layer.

4. The semiconductor device according to claim 3, wherein the distance between said top and bottom surfaces of said source/drain layer is 0.1 μm, and said defect layer which is produced by heat treatment extends 0.06 to 0.08 μm above said bottom surface.

* * * * *